United States Patent
Heo et al.

(10) Patent No.: US 11,772,236 B2
(45) Date of Patent: Oct. 3, 2023

(54) POROUS POLISHING PAD AND PROCESS FOR PRODUCING THE SAME ALL FEES

(71) Applicant: SK enpulse Co., Ltd., Gyeonggi-do (KR)

(72) Inventors: Hye Young Heo, Gyeonggi-do (KR); Jang Won Seo, Busan (KR); Jong Wook Yun, Gyeonggi-do (KR); Sunghoon Yun, Gyeonggi-do (KR); Jaein Ahn, Gyeonggi-do (KR)

(73) Assignee: SK enpulse Co., Ltd., Gyeonggi-do (KR)

( * ) Notice: Subject to any disclaimer, the term of this patent is extended or adjusted under 35 U.S.C. 154(b) by 1145 days.

(21) Appl. No.: 16/385,653

(22) Filed: Apr. 16, 2019

(65) Prior Publication Data
US 2019/0314954 A1    Oct. 17, 2019

(30) Foreign Application Priority Data
Apr. 17, 2018 (KR) .......................... 10-2018-0044465

(51) Int. Cl.
*B24D 3/34* (2006.01)
*B24B 37/24* (2012.01)
(Continued)

(52) U.S. Cl.
CPC .............. *B24D 3/348* (2013.01); *B24B 37/22* (2013.01); *B24B 37/24* (2013.01); *B24D 3/28* (2013.01); *B24D 11/005* (2013.01); *C08J 9/32* (2013.01); *C08J 2203/22* (2013.01); *C08J 2205/044* (2013.01); *C08J 2205/048* (2013.01); *C08J 2207/00* (2013.01); *C08J 2375/04* (2013.01);
(Continued)

(58) Field of Classification Search
CPC ........ B24D 3/348; B24D 3/28; B24D 11/005; B24B 37/22; B24B 37/24; C08J 9/32; C08J 2205/044; C08J 2205/048; C08J 2207/00; C08J 2375/04
See application file for complete search history.

(56) References Cited

U.S. PATENT DOCUMENTS

2004/0171339 A1 * 9/2004 Prasad ..................... B24D 3/32
451/526

FOREIGN PATENT DOCUMENTS

JP    2013-539927 A    10/2013
JP    2015-120220    *  7/2015 ............. B24B 37/00
(Continued)

OTHER PUBLICATIONS

Office Action for the Korean Patent Application No. 10-2018-0044465 issued by the Korean Intellectual Property Office dated May 17, 2019.
(Continued)

*Primary Examiner* — Pegah Parvini
(74) *Attorney, Agent, or Firm* — IP & T GROUP LLP (57) ABSTRACT

Embodiments relate to a porous polishing pad for use in a chemical mechanical planarization (CMP) process of semiconductors and a process for preparing the same. According to the embodiments, the size and distribution of the plurality of pores contained in the porous polishing pad can be adjusted in light of the volume thereof. Thus, the plurality of pores have an apparent volume-weighted average pore diameter in a specific range, thereby providing a porous polishing pad that is excellent in such physical properties as polishing rate and the like.

20 Claims, 3 Drawing Sheets

(51) Int. Cl.
  *B24B 37/22*   (2012.01)
  *B24D 3/28*    (2006.01)
  *B24D 11/00*   (2006.01)
  *C08J 9/32*    (2006.01)
  *H01L 21/304*  (2006.01)
(52) U.S. Cl.
  CPC ...... *H01L 21/304* (2013.01); *H01L 2924/069* (2013.01)

(56) References Cited

FOREIGN PATENT DOCUMENTS

| | | |
|---|---|---|
| JP | 2016-128204 A | 7/2016 |
| KR | 10-0418648 | 2/2004 |
| KR | 10-2005-0106026 | 11/2005 |
| KR | 10-2016-0027075 | 3/2016 |
| KR | 10-1835090 | 3/2018 |

OTHER PUBLICATIONS

Office Action for the Japanese Patent Application No. 2019-077738 issued by Japanese Patent Office dated Jul. 28, 2020.

* cited by examiner

POROUS POLISHING PAD AND PROCESS FOR PRODUCING THE SAME ALL FEES

The present application claims priority of Korean patent application number 10-2018-0044465 filed on Apr. 17, 2018, which is incorporated herein by reference in its entirety.

TECHNICAL FIELD

Embodiments relate to a porous polishing pad for use in a chemical mechanical planarization (CMP) process of semiconductors and a process for preparing the same.

BACKGROUND ART

The chemical mechanical planarization (CMP) process in a process for preparing semiconductors refers to a step in which a wafer is fixed to a head and in contact with the surface of a polishing pad mounted on a platen, and the wafer is then chemically treated by supplying a slurry while the platen and the head are relatively moved to thereby mechanically planarize the irregularities on the wafer surface.

A polishing pad is an essential member that plays an important role in such a CMP process. In general, a polishing pad is composed of a polyurethane-based resin and has grooves on its surface for a large flow of a slurry and pores for supporting a fine flow thereof.

The pores in a polishing pad may be formed by using a solid phase foaming agent having voids, a liquid phase foaming agent filled with a volatile liquid, an inert gas, a fiber, or the like, or by generating a gas by a chemical reaction.

As the solid phase foaming agent, microcapsules (i.e., thermally expanded microcapsules), whose size has been adjusted by a thermal expansion, are used. Since the thermally expanded microcapsules in a structure of already expanded micro-balloons have a uniform particle diameter, the diameter of pores can be uniformly controlled. However, the thermally expanded microcapsules have a disadvantage in that it is difficult to control the pores to be formed since the shape of the microcapsules changes under the reaction condition of a high temperature of 100° C. or higher.

Accordingly, although pores can be formed in conformation with the size and distribution as designed when micropores are implemented using a single solid phase foaming agent as in the conventional processes, the degree of freedom in designing the pores is low, and there is a limit in controlling the pore distribution.

Korean Laid-open Patent Publication No. 2016-0027075 discloses a process for producing a low-density polishing pad using an inert gas and a pore inducing polymer, and a low-density polishing pad. However, this patent publication has a limitation in the adjustment of the size and distribution of pores and fails to teach the polishing rate of the polishing pad.

Likewise, Korean Patent No. 10-0418648 discloses a process for producing a polishing pad using two kinds of solid phase foaming agents that have different particle diameters. However, this patent also has a limitation in the adjustment of the size and distribution of pores.

PRIOR ART DOCUMENT

Patent Document (Patent Document 1) Korean Laid-open Patent Publication No. 2016-0027075 (Patent Document 2) Korean Patent No. 10-0418648

DISCLOSURE OF THE INVENTION

Technical Problem to be Solved

Accordingly, it is an object of the embodiments to provide a porous polishing pad having an enhanced polishing rate in which the size and distribution of pores are controlled, and a process for preparing the same.

Solution to the Problem

In order to achieve the above object, an embodiment provides a porous polishing pad, which comprises a urethane-based resin; and a plurality of pores,
wherein the plurality of pores have an apparent volume-weighted average pore diameter (AVWAPD) of 20 μm to 50 μm as calculated according to the following Equation 1:

$$\frac{\Sigma(\text{diameter of pores} \times \text{apparent volume of pores})}{\text{total apparent volume of pores}} \quad [\text{Equation 1}]$$

Another embodiment provides a process for preparing a porous polishing pad, which comprises preparing a mixture of solid phase foaming agents by mixing at least three solid phase foaming agents having different particle diameter distributions;
preparing a raw material mixture by mixing a urethane-based prepolymer, the mixture of solid phase foaming agents, and a curing agent; and
injecting the raw material mixture into a mold and molding it.

Advantageous Effects of the Invention

According to the embodiments, the size and distribution of the plurality of pores contained in a porous polishing pad can be adjusted. Thus, the plurality of pores may have an apparent volume-weighted average pore diameter in a specific range, thereby providing a porous polishing pad that is excellent in such physical properties as polishing rate and the like.

DETAILED DESCRIPTION FOR CARRYING OUT THE INVENTION

Description of Terms

Unless otherwise stated or defined, all technical and scientific terms used herein have the same meaning as commonly understood by one of ordinary skill in the art to which this invention pertains.

Unless otherwise stated, all percentages, parts, and ratios are by weight.

All numerical ranges related to the quantities of components, physical properties such as molecular weight, reaction conditions, and the like used herein in all circumstances are to be understood as being modified by the term "about."

In this specification, when a part is referred to as "comprising" an element, it is to be understood that it may comprise other elements as well, rather than excluding the other elements, unless specifically stated otherwise.

The term "plurality of" as used herein refers to more than one.

The term "D50" as used herein refers to the volume fraction of the 50$^{th}$ percentile (median) of a particle size distribution.

Hereinafter, the present invention is explained in detail by the following embodiments. The embodiments can be modified into various forms as long as the gist of the invention is not changed.

Porous Polishing Pad

The porous polishing pad of an embodiment comprises a urethane-based resin; and a plurality of pores, wherein the plurality of pores have an apparent volume-weighted average pore diameter (AVWAPD) of 20 μm to 50 μm as calculated according to the following Equation 1:

$$\frac{\Sigma(\text{diameter of pores} \times \text{apparent volume of pores})}{\text{total apparent volume of pores}} \quad \text{[Equation 1]}$$

The plurality of pores are present as dispersed in the polyurethane resin. The plurality of pores may be derived from a solid phase foaming agent. The solid phase foaming agent will be described in detail in the following section.

In this specification, the "apparent volume-weighted average pore diameter (AVWAPD)" is a value calculated according to the above Equation 1. The denominator "total apparent volume of pores" in the above Equation 1 is calculated from the diameter of each of the plurality of pores. Specifically, the diameter of each of the plurality of pores observed using a scanning electron microscope and an image analysis software is measured based on the unit area (1 mm$^2$) of the porous polishing pad. Since the plurality of pores are substantially in a globular shape, the apparent volume of the plurality of pores exposed on the unit area is assumed as the volume of a hemisphere each having a diameter r and calculated according to the equation $2\pi/3 \times (r/2)^3$. The sum of these values is the total apparent volume of pores, which is substituted into the denominator of the above Equation 1. Meanwhile, the diameter of each of the plurality of pores measured above is multiplied by the apparent volume of each of the plurality of pores calculated therefrom. All of these values are summed up and substituted into the numerator of the above Equation 1. The value thus calculated is defined as the apparent volume-weighted average pore diameter (AVWAPD) of the plurality of pores.

The flowability and the polishing efficiency of the polishing pad hinge on the volume of the pores exposed on the surface of the polishing pad. That is, the depth and size of the pores exposed on the surface of the polishing pad may affect the flowability of the polishing slurry, whereby the occurrence of scratches and the like on the surface of an object to be polished and the polishing rate are determined. Since the porous polishing pad according to an embodiment is prepared such that the apparent volume-weighted average pore diameter thereof is within a proper range, the surface structure thereof can be appropriately designed. As a result, it is possible to minimize such defects as scratches on the surface of an object to be polished and to achieve excellent polishing efficiency.

Specifically, in the porous polishing pad, the AVWAPD may be 50 μm or less. Specifically, the AVWAPD may be 20 μm to 50 μm. More specifically, the AVWAPD may be 30 μm to 45 μm. Even more specifically, the AVWAPD may be 30 μm to 41 μm. Even more specifically, the AVWAPD may be 35 μm to 41 μm. Even more specifically, the AVWAPD may be 37 μm to 41 μm. Even more specifically, the AVWAPD may be 38 μm to 41 μm. Even more specifically, the AVWAPD may be 39 μm to 41 μm. But it is not limited thereto. If the AVWAPD is within the above range, such physical properties of the polishing pad as elastic modulus and polishing rate are enhanced.

When the AVWAPD is X, the plurality of pores may comprise first pores having a diameter of greater than 0 μm to X μm and second pores having a diameter of greater than X μm. The total apparent volume of the first pores may be greater than the total apparent volume of the second pores. Specifically, the total apparent volume of the first pores is 55% by volume to 90% by volume based on the total apparent volume of the plurality of pores. The total apparent volume of the second pores is 10% by volume to 45% by volume based on the total apparent volume of the plurality of pores. More specifically, the total apparent volume of the first pores is 55% by volume to 80% by volume based on the total apparent volume of the plurality of pores. Even more specifically, the total apparent volume of the first pores is 55% by volume to 70% by volume based on the total apparent volume of the plurality of pores. Even more specifically, the total apparent volume of the first pores is 55% by volume to 65% by volume based on the total apparent volume of the plurality of pores. Even more specifically, the total apparent volume of the first pores is 58% by volume to 62% by volume based on the total apparent volume of the plurality of pores. But it is not limited thereto. As the total apparent volume of the first pores is changed, the total apparent volume of the second pores is changed as well. In such event, the total apparent volume of the second pores is a value obtained by subtracting the total apparent volume of the first pores from 100.

Meanwhile, the first pores may comprise first-first pores having a diameter of greater than 0 μm to X−20 μm; first-second pores having a diameter of greater than X−20 μm to X−10 μm; and first-third pores having a diameter of greater than X−10 μm to X μm.

The total apparent volume of the first-first pores may be 5% by volume to 10% by volume based on the total apparent volume of the plurality of pores. Specifically, the total apparent volume of the first-first pores may be 5% by volume to 9% by volume based on the total apparent volume of the plurality of pores. But it is not limited thereto.

The total apparent volume of the first-second pores may be 15% by volume to 25% by volume based on the total apparent volume of the plurality of pores. Specifically, the total apparent volume of the first-second pores may be 19% by volume to 25% by volume based on the total apparent volume of the plurality of pores. But it is not limited thereto.

The total apparent volume of the first-third pores may be 30% by volume to 45% by volume based on the total apparent volume of the plurality of pores. Specifically, the total apparent volume of the first-third pores may be 30% by volume to 40% by volume based on the total apparent volume of the plurality of pores. More specifically, the total apparent volume of the first-third pores may be 31% by volume to 33% by volume based on the total apparent volume of the plurality of pores. But it is not limited thereto.

Here, the sum of the total apparent volumes of the first-first, first-second, and first-third pores is equal to the sum of the total apparent volumes of the first pores.

Meanwhile, the second pores may comprise second-first pores having a diameter of greater than X μm to X+10 μm; and second-second pores having a diameter of greater than X+10 μm.

The total apparent volume of the second-first pores may be 5% by volume to 20% by volume based on the total apparent volume of the plurality of pores. Specifically, the total apparent volume of the second-first pores may be 10% by volume to 20% by volume based on the total apparent volume of the plurality of pores. Even more specifically, the total apparent volume of the second-first pores may be 14% by volume to 20% by volume based on the total apparent volume of the plurality of pores. But it is not limited thereto.

The total apparent volume of the second-second pores may be 5% by volume to 25% by volume based on the total apparent volume of the plurality of pores. Specifically, the total apparent volume of the second-second pores may be 10% by volume to 25% by volume based on the total apparent volume of the plurality of pores. More specifically, the total apparent volume of the second-second pores may be 15% by volume to 25% by volume based on the total apparent volume of the plurality of pores. Even more specifically, the total apparent volume of the second-second pores may be 20% by volume to 25% by volume based on the total apparent volume of the plurality of pores. But it is not limited thereto.

Here, the sum of the total apparent volumes of the second-first and second-second pores is equal to the sum of the total apparent volumes of the second pores.

In addition, the sum of the total apparent volumes of the first pores and the second pores is 100% by volume.

The pores contained in the porous polishing pad according to an embodiment comprise all of the above configurations.

The porous polishing pad may contain the pores in an amount of 15 to 70% by volume or 15 to 40% by volume based on the total apparent volume of the polishing pad.

Solid Phase Foaming Agent

The solid phase foaming agent may be a mixture of at least three solid phase foaming agents that have different particle diameter distributions. Specifically, the solid phase foaming agent may be a mixture of at least four solid phase foaming agents that have different particle diameter distributions. More specifically, the solid phase foaming agent may be a mixture of at least five solid phase foaming agents that have different particle diameter distributions.

The mixture of solid phase foaming agents may comprise a first solid phase foaming agent, a second solid phase foaming agent, and a third solid phase foaming agent. Specifically, the mixture of solid phase foaming agents may comprise a first solid phase foaming agent; a second solid phase foaming agent having a D50 greater than the D50 of the first solid phase foaming agent; and a third solid phase foaming agent having a D50 greater than the D50 of the second solid phase foaming agent.

The first solid phase foaming agent may have a D50 of less than 20 μm. Specifically, the first solid phase foaming agent may have a D50 of greater than 0 to less than 20 μm. More specifically, the first solid phase foaming agent may have a D50 of 5 μm to less than 20 μm. Even more specifically, the first solid phase foaming agent may have a D50 of 9 μm to less than 20 μm. Even more specifically, the first solid phase foaming agent may have a D50 of 9 μm to 18 μm. Even more specifically, the first solid phase foaming agent may have a D50 of 12 μm to 18 μm; 10 μm to 16 μm; 9 μm to 15 μm; or 10 μm to 18 μm. But it is not limited thereto.

The second solid phase foaming agent is not limited in its range as long as it has a D50 greater than the D50 of the first solid phase foaming agent and smaller than the D50 of the third solid phase foaming agent. Specifically, the second solid phase foaming agent may have a D50 of 10 μm to 30 μm. More specifically, the second solid phase foaming agent may have a D50 of 15 μm to 30 μm. Even more specifically, the second solid phase foaming agent may have a D50 of 15 μm to 25 μm or 17 μm to 23 μm. But it is not limited thereto.

The third solid phase foaming agent is not limited in its range as long as it has a D50 greater than the D50 of the second solid phase foaming agent. Specifically, the third solid phase foaming agent may have a D50 of 15 μm to 60 μm. More specifically, the third solid phase foaming agent may have a D50 of 20 μm to 60 μm. Even more specifically, the third solid phase foaming agent may have a D50 of 20 μm to 55 μm. Even more specifically, the third solid phase foaming agent may have a D50 of 20 μm to 40 μm; 30 μm to 50 μm; or 35 μm to 55 μm. But it is not limited thereto.

The content of the first, second, and third solid phase foaming agents contained in the mixture of solid phase foaming agents may be appropriately adjusted such that the apparent volume-weighted average pore diameter of the plurality of pores falls within the above range. As the content of each solid phase foaming agent is changed, the content of the other solid phase foaming agents may be appropriately adjusted.

The mixture of solid phase foaming agents may comprise 10% by weight to 40% by weight of the first solid phase foaming agent based on the total weight of the mixture of solid phase foaming agents. Specifically, the first solid phase foaming agent may be employed in an amount of 20% by weight to 40% by weight based on the total weight of the mixture of solid phase foaming agents. More specifically, the first solid phase foaming agent may be employed n an amount of 30% by weight to 40% by weight based on the total weight of the mixture of solid phase foaming agents. Even more specifically, the first solid phase foaming agent may be employed n an amount of 32% by weight to 38% by weight based on the total weight of the mixture of solid phase foaming agents. But it is not limited thereto.

The mixture of solid phase foaming agent may comprise 10% by weight to 30% by weight of the second solid phase foaming agent based on the total weight of the mixture of solid phase foaming agents. Specifically, the mixture of solid phase foaming agent may comprise 20% by weight to 30% by weight of the second solid phase foaming agent based on the total weight of the mixture of solid phase foaming agents. More specifically, the mixture of solid phase foaming agent may comprise 20% by weight to 25% by weight of the second solid phase foaming agent based on the total weight of the mixture of solid phase foaming agents. But it is not limited thereto.

The mixture of solid phase foaming agent may comprise 30% by weight to 80% by weight of the third solid phase foaming agent based on the total weight of the mixture of solid phase foaming agents. Specifically, the mixture of solid phase foaming agent may comprise 30% by weight to 70% by weight of the third solid phase foaming agent based on the total weight of the mixture of solid phase foaming agents. More specifically, the mixture of solid phase foaming agent may comprise 30% by weight to 60% by weight of the third solid phase foaming agent based on the total weight of the mixture of solid phase foaming agents. Even more specifically, the mixture of solid phase foaming agent may comprise 30% by weight to 50% by weight of the third solid phase foaming agent based on the total weight of the mixture of solid phase foaming agents. Even more specifically, the mixture of solid phase foaming agent may comprise 40% by weight to 50% by weight of the third solid phase foaming agent based on the total weight of the mixture of solid phase foaming agents. But it is not limited thereto.

The mixture of solid phase foaming agent may comprise 10% by weight to 40% by weight of the first solid phase foaming agent, 10% by weight to 30% by weight of the second solid phase foaming agent, and 30% by weight to 80% by weight of the third solid phase foaming agent based on the total weight of the mixture of solid phase foaming agents. Specifically, the mixture of solid phase foaming agent may comprise 30% by weight to 40% by weight of the first solid phase foaming agent, 20% by weight to 30% by weight of the second solid phase foaming agent, and 40% by weight to 50% by weight of the third solid phase foaming agent based on the total weight of the mixture of solid phase foaming agents.

The first, second, and third solid phase foaming agents may be thermally expanded (i.e., size-controlled) microcapsules. The thermally expanded (i.e., size-controlled) microcapsules may be obtained by thermally expanding thermally expandable microcapsules.

The thermally expandable microcapsules may comprise a shell comprising a thermoplastic resin; and a foaming agent encapsulated inside the shell. The thermoplastic resin may be at least one selected from the group consisting of a vinylidene chloride-based copolymer, an acrylonitrile-based copolymer, a methacrylonitrile-based copolymer, and an acrylic copolymer. Further, the foaming agent encapsulated in the inside may be at least one selected from the group consisting of hydrocarbons having 1 to 7 carbon atoms. Specifically, the foaming agent encapsulated in the inside may be selected from the group consisting of a low molecular weight hydrocarbon such as ethane, ethylene, propane, propene, n-butane, isobutane, butene, isobutene, n-pentane, isopentane, neopentane, n-hexane, heptane, petroleum ether, and the like; a chlorofluorohydrocarbon such as trichlorofluoromethane ($CCl_3F$), dichlorodifluoromethane ($CCl_2Fh_2$), chlorotrifluoromethane ($CClF_3$), tetrafluoroethylene ($CClF_2$—$CClF_2$), and the like; and a tetraalkylsilane such as tetramethylsilane, trimethylethylsilane, trimethylisopropylsilane, trimethyl-n-propylsilane, and the like.

Urethane-Based Resin

The porous polishing pad comprises a urethane-based resin, specifically a polyurethane resin. The polyurethane resin may be derived from a urethane-based prepolymer having an isocyanate terminal group. In such event, the polyurethane resin comprises monomer units that constitute the prepolymer.

A prepolymer generally refers to a polymer having a relatively low molecular weight wherein the degree of polymerization is adjusted to an intermediate level for the sake of convenient molding a product in the process of producing the same. A prepolymer may be molded by itself or after a reaction with another polymerizable compound. For example, a prepolymer may be prepared by reacting an isocyanate compound with a polyol.

For example, the isocyanate compound that may be used in the preparation of the urethane-based prepolymer may be at least one isocyanate selected from the group consisting of toluene diisocyanate (TDI), naphthalene-1,5-diisocyanate, p-phenylene diisocyanate, tolidine diisocyanate, 4,4'-diphenyl methane diisocyanate, hexamethylene diisocyanate, dicyclohexylmethane diisocyanate, and isophorone diisocyanate. But it is not limited thereto.

For example, the polyol that may be used in the preparation of the urethane-based prepolymer may be at least one polyol selected from the group consisting of a polyether polyol, a polyester polyol, a polycarbonate polyol, and an acryl polyol. But it is not limited thereto. The polyol may have a weight average molecular weight (Mw) of 300 g/mole to 3,000 g/mole.

The urethane-based resin may have a weight average molecular weight of 500 g/mole to 3,000 g/mole. Specifically, the urethane-based resin may have a weight average molecular weight (Mw) of 600 g/mole to 2,000 g/mole or 700 g/mole to 1,500 g/mole.

Physical Properties of the Porous Polishing Pad

As described above, when the AVWAPD of the porous polishing pad according to the embodiment is within the above range, such physical properties of the polishing pad as elastic modulus and polishing rate are remarkably enhanced.

Specifically, the porous polishing pad may have a total number of pores of 600 or more per unit area ($mm^2$) of the porous polishing pad. More specifically, the total number of pores may be 700 or more per unit area ($mm^2$) of the porous polishing pad. Even more specifically, the total number of pores may be 800 or more per unit area ($mm^2$) of the porous polishing pad. Even more specifically, the total number of pores may be 900 or more per unit area ($mm^2$) of the porous polishing pad. But it is not limited thereto. In addition, the total number of pores may be 1,500 or less, specifically 1,200 or less, per unit area ($mm^2$) of the porous polishing pad. But it is not limited thereto. Thus, the total number of pores may be 800 to 1,500, for example, 800 to 1,200, per unit area ($mm^2$) of the porous polishing pad. But it is not limited thereto.

Specifically, the porous polishing pad may have an average polishing rate (Å/min) of 3,100 or more as calculated by the following Equation 2 when a silicon wafer having a silicon oxide film is polished with a silica slurry. More specifically, the average polishing rate (Å/min) may be 3,200 or more. But it is not limited thereto. The upper limit of the average polishing rate (Å/min) of the porous polishing pad may be 3,500. But it is not limited thereto.

Polishing rate=polished thickness of a silicon wafer (Å)/polishing time (minute)    [Equation 2]

Specifically, the porous polishing pad may have an elastic modulus of 60 kgf/cm² or more. More specifically, the porous polishing pad may have an elastic modulus of 100 kgf/cm² or more. But it is not limited thereto. The upper limit of the elastic modulus of the porous polishing pad may be 150 kgf/cm². But it is not limited thereto.

In addition, the porous polishing pad according to the embodiment is excellent in the basic physical properties of a polishing pad such as withstand voltage, specific gravity, surface hardness, tensile strength, and elongation.

The physical properties of the porous polishing pad such as specific gravity and hardness can be controlled through the molecular structure of the urethane-based prepolymer polymerized by the reaction between an isocyanate and a polyol.

Specifically, the porous polishing pad may have a hardness of 30 Shore D to 80 Shore D. More specifically, the porous polishing pad may have a hardness of 40 Shore D to 70 Shore D. But it is not limited thereto.

Specifically, the porous polishing pad may have a specific gravity of 0.6 g/cm³ to 0.9 g/cm³. More specifically, the porous polishing pad may have a specific gravity of 0.7 g/cm³ to 0.85 g/cm³. But it is not limited thereto.

Specifically, the porous polishing pad may have a tensile strength of 10 N/mm² to 100 N/mm². More specifically, the porous polishing pad may have a tensile strength of 15 N/mm² to 70 N/mm². Even more specifically, the porous polishing pad may have a tensile strength of 20 N/mm² to 70 N/mm². But it is not limited thereto.

Specifically, the porous polishing pad may have an elongation of 30% to 300%. More specifically, the porous polishing pad may have an elongation of 50% to 200%.

The porous polishing pad may have a withstand voltage of 14 kV to 23 kV, a thickness of 1.5 mm to 2.5 mm, a specific gravity of 0.7 g/cm³ to 0.9 g/cm³, a surface hardness at 25° C. of 50 shore D to 65 shore D, a tensile strength of 15 N/mm² to 25 N/mm², and an elongation of 80% to 250%. But it is not limited thereto.

The porous polishing pad may have a thickness of 1 mm to 5 mm. Specifically, the porous polishing pad may have a thickness of 1 mm to 3 mm, 1 mm to 2.5 mm, 1.5 mm to 5 mm, 1.5 mm to 3 mm, 1.5 mm to 2.5 mm, 1.8 mm to 5 mm, 1.8 mm to 3 mm, or 1.8 mm to 2.5 mm. If the thickness of the polishing pad is within the above range, the basic physical properties of the polishing pad can be sufficiently exhibited.

The porous polishing pad may have grooves on its surface for mechanical polishing. The grooves may have a depth, a width, and a spacing as desired for mechanical polishing, which are not particularly limited.

The porous polishing pad according to the embodiment may simultaneously have the physical properties of the polishing pad as described above.

Process for Preparing a Porous Polishing Pad

According to an embodiment, there is provided a process for preparing a porous polishing pad, which comprises preparing a mixture of solid phase foaming agents by mixing at least three solid phase foaming agents that have different particle diameter distributions; preparing a raw material mixture by mixing a urethane-based prepolymer, the mixture of solid phase foaming agents, and a curing agent; and injecting the raw material mixture into a mold and molding it.

Specifically, the raw material mixture may comprise 0.5 part by weight to 10 parts by weight of the mixture of solid phase foaming agents per 100 parts by weight of the urethane-based prepolymer. More specifically, the raw material mixture may comprise 0.5 part by weight to 5 parts by weight of the mixture of solid phase foaming agents per 100 parts by weight of the urethane-based prepolymer. Even more specifically, the raw material mixture may comprise 2 parts by weight to 4 parts by weight of the mixture of solid phase foaming agents per 100 parts by weight of the urethane-based prepolymer.

Supply of Raw Materials

The urethane-based prepolymer may be prepared by reacting an isocyanate compound with a polyol as described above. The specific types of the isocyanate compound and the polyol are as exemplified above with respect to the porous polishing pad.

The urethane-based prepolymer may have a weight average molecular weight of 500 g/mole to 3,000 g/mole. Specifically, the urethane-based prepolymer may have a weight average molecular weight (Mw) of 600 g/mole to 2,000 g/mole or 800 g/mole to 1,000 g/mole.

As an example, the urethane-based prepolymer may be a polymer having a weight average molecular weight (Mw) of 500 g/mole to 3,000 g/mole, which is polymerized from toluene diisocyanate as an isocyanate compound and polytetramethylene ether glycol as a polyol.

Mixture of Solid Phase Foaming Agents

The mixture of solid phase foaming agents is as described above with respect to the porous polishing pad.

Curing Agent

The curing agent may be at least one of an amine compound and an alcohol compound. Specifically, the curing agent may comprise at least one compound selected from the group consisting of an aromatic amine, an aliphatic amine, an aromatic alcohol, and an aliphatic alcohol.

For example, the curing agent may be at least one selected from the group consisting of 4,4'-methylenebis(2-chloroaniline) (MOCA), diethyltoluenediamine, diaminodiphenyl methane, diaminodiphenyl sulphone, m-xylylene diamine, isophoronediamine, ethylenediamine, diethylenetriamine, triethylenetetramine, polypropylenediamine, polypropylenetriamine, ethylene glycol, diethylene glycol, dipropylene glycol, butanediol, hexanediol, glycerin, trimethylolpropane, and bis(4-amino-3-chlorophenyl)methane.

The urethane-based prepolymer and the curing agent may be mixed at a molar equivalent ratio of 1:0.8 to 1:1.2, or a molar equivalent ratio of 1:0.9 to 1:1.1, based on the number of moles of the reactive groups in each molecule. Here, "the number of moles of the reactive groups in each molecule" refers to, for example, the number of moles of the isocyanate group in the urethane-based prepolymer and the number of moles of the reactive groups (e.g., amine group, alcohol group, and the like) in the curing agent. Therefore, the urethane-based prepolymer and the curing agent may be fed at a constant rate during the mixing process by controlling the feeding rate such that the urethane-based prepolymer and the curing agent are fed in amounts per unit time that satisfies the molar equivalent ratio exemplified above.

Reaction and Formation of Pores

The urethane-based prepolymer and the curing agent react with each other upon the mixing thereof to form a solid polyurethane, which is then formed into a sheet or the like. Specifically, the isocyanate terminal group in the urethane-based prepolymer can react with the amine group, the alcohol group, and the like in the curing agent. In such event, the solid phase foaming agents are uniformly dispersed in the raw materials to form pores without participating in the reaction between the urethane-based prepolymer and the curing agent.

Molding

The molding is carried out using a mold. Specifically, the raw materials sufficiently stirred in a mixing head or the like may be injected into a mold to fill the inside thereof. The reaction between the urethane-based prepolymer and the curing agent is completed in the mold to thereby produce a molded body in the form of a solidified cake that conforms to the shape of the mold.

Thereafter, the molded body thus obtained can be appropriately sliced or cut into a sheet for the production of a polishing pad. As an example, a molded body is prepared in a mold having a height of 5 to 50 times the thickness of a polishing pad to be finally produced and is then sliced in the same thickness to produce a plurality of sheets for the polishing pads at a time. In such event, a reaction retarder may be used as a reaction rate controlling agent in order to secure a sufficient solidification time. Thus, the height of the mold may be 5 to 50 times the thickness of the polishing pad to be finally produced to prepare sheets therefor. However, the sliced sheets may have pores of different diameters depending on the molded location inside the mold. That is, a sheet molded at the lower position of the mold has pores of a fine diameter, whereas a sheet molded at the upper position of the mold may have pores of a larger diameter than that of the sheet formed at the lower position.

Therefore, it is preferable to use a mold capable of producing one sheet by one molding in order for sheets to have pores of a uniform size with each other. To this end, the height of the mold may not significantly differ from the thickness of the porous polishing pad to be finally produced. For example, the molding may be carried out using a mold having a height of 1 to 3 times the thickness of the porous polishing pad to be finally produced. More specifically, the mold may have a height of 1.1 to 2.5 times, or 1.2 to 2 times, the thickness of the polishing pad to be finally produced. In such event, a reaction promoter may be used as the reaction rate controlling agent to form pores having a more uniform diameter. The porous polishing pad prepared from a single sheet may have a thickness of 1 mm to 5 mm. Specifically, the porous polishing pad may have a thickness of 1 mm to 3 mm, 1 mm to 2.5 mm, 1.5 mm to 5 mm, 1.5 mm to 3 mm, 1.5 mm to 2.5 mm, 1.8 mm to 5 mm, 1.8 mm to 3 mm, or 1.8 mm to 2.5 mm.

Thereafter, the top and bottom ends of the molded body obtained from the mold can be cut out, respectively. For example, each of the top and bottom ends of the molded body may be cut out by 1/3 or less, 1/22 to 3/10, or 1/12 to 1/4 of the total thickness of the molded body.

As a specific example, the molding is carried out using a mold having a height of 1.2 to 2 times the thickness of the porous polishing pad to be finally produced, and a further step of cutting out each of the top and bottom ends of the molded body obtained from the mold upon the molding by 1/12 to 1/4 of the total thickness of the molded body may then be carried out.

Subsequent to the above cutting step, the above preparation process may further comprise the steps of machining grooves on the surface of the molded body, bonding with the lower part, inspection, packaging, and the like. These steps may be carried out in a conventional manner for preparing a polishing pad.

In addition, the porous polishing pad prepared by the preparation process as described above may have all of the characteristics of the porous polishing pad according to the embodiment as described above.

EXAMPLE

Hereinafter, specific examples of the present invention will be provided. However, these examples are set forth to illustrate the present invention, and the scope of the present invention is not limited thereto.

Preparation Examples 1 to 4 and Comparative Preparation Examples 1 to 3 Preparation of Foaming Agents Foaming agents to be used in the preparation of polishing pads of the Examples and Comparative Examples were prepared with the composition shown in Table 1 below. In Preparation Examples 1 to 4, three kinds of solid phase foaming agents were mixed to prepare a mixture of solid phase foaming agents. In Comparative Preparation Examples 1 and 2, two kinds of solid phase foaming agents were mixed to prepare a mixture of solid phase foaming agents. In Comparative Preparation Example 3, an inert gas ($N_2$) was used.

TABLE 1

| | Foaming agent (% by weight) | | | | | | | | | |
|---|---|---|---|---|---|---|---|---|---|---|
| | A-1 | A-2 | A-3 | A-4 | B-1 | B-2 | C-1 | C-2 | C-3 | D |
| Prep. Ex. 1 | 35 | | | | 20 | | 45 | | | |
| Prep. Ex. 2 | 35 | | | | | 20 | 45 | | | |
| Prep. Ex. 3 | | 30 | | | 25 | | | 45 | | |
| Prep. Ex. 4 | | | 30 | | 25 | | | | 45 | |
| C. Prep. Ex. 1 | | | | | 40 | | 60 | | | |
| C. Prep. Ex. 2 | | | | | | 50 | | 50 | | |
| C. Prep. Ex. 3 | | | | | | | | | | 100 |

(First solid phase foaming agent)
A-1: Matsumoto Microsphere ® F-65 (D50: 12 to 18 μm)
A-2: Matsumoto Microsphere ® F-36 (D50: 10 to 16 μm)
A-3: Matsumoto Microsphere ® F-48 (D50: 9 to 15 μm)
A-4: Matsumoto Microsphere ® F-50 (D50: 10 to 18 μm)
(Second solid phase foaming agent)
B-1: Expancel ® 461 DE 20 d70 (D50: 15 to 25 μm)
B-2: Matsumoto Microsphere ® F-100M (D50: 17 to 23 μm)
(Third solid phase foaming agent)
C-1: Expancel ® 461 DE 40 d60 (D50: 20 to 40 μm)
C-2: Expancel ® 551 DE 40 d42 (D50: 30 to 50 μm)
C-3: Expancel ® 920 DE 40 d30 (D50: 35 to 55 μm)
(Gas phase foaming agent)
D: inert gas ($N_2$)

Example 1: Preparation of a Porous Polishing Pad

1-1: Configuration of the Device

In a casting machine equipped with feeding lines for a urethane-based prepolymer, a curing agent, and a solid phase foaming agent, PUGL-550D (supplied by SKC) having an unreacted NCO content of 9.1% by weight was charged to the prepolymer tank, and bis(4-amino-3-chlorophenyl)methane (supplied by Ishihara) was charged to the curing agent tank. In addition, 3 parts by weight of the mixture of solid phase foaming agents prepared in the Preparation Example 1 per 100 parts by weight of the urethane-based prepolymer was mixed in advance and then charged into the prepolymer tank.

1-2: Preparation of a Sheet

The urethane-based prepolymer and the curing agent were stirred while they were fed to the mixing head at constant rates through the respective feeding lines. In such event, the molar equivalent ratio of the NCO group in the urethane-based prepolymer to the reactive groups in the curing agent was adjusted to 1:1, and the total feeding amount was maintained at a rate of 10 kg/min.

The mixed raw materials were injected into a mold and prepared to a single sheet. Thereafter, the surface of the porous polyurethane sheet was ground using a grinder and then grooved using a tip so that it had an average thickness of 2 mm and an average diameter of 76.2 cm.

The porous polyurethane sheet and suede (a substrate layer with an average thickness of 1.1 mm) were thermally bonded at 120° C. with a hot-melt film (supplied by SKC under the brand name of TF-00) to produce a polishing pad.

Examples 2 to 4 and Comparative Examples 1 and 2: Preparation of a Porous Polishing Pad Polishing pads were prepared in the same manner as in Example 1 except that the mixtures of solid phase foaming agents prepared in Preparation Examples 2 to 4 and Comparative Preparation Examples 1 and 2 were used, respectively.

Comparative Example 3: Preparation of a Porous Polishing Pad

1-1: Configuration of the Device

In a casting machine equipped with feeding lines for a urethane-based prepolymer, a curing agent, and an inert gas, PUGL-550D (SKC) having an unreacted NCO content of 9.1% by weight was charged to the prepolymer tank, and bis(4-amino-3-chlorophenyl)methane (Ishihara) was charged to the curing agent tank. Nitrogen gas ($N_2$) of Comparative Preparation Example was prepared as an inert gas.

1-2: Preparation of a Sheet

The urethane-based prepolymer, the curing agent, and the nitrogen gas ($N_2$) were stirred while they were fed to the mixing head at constant rates through the respective feeding lines. In such event, the molar equivalent ratio of the NCO group in the urethane-based prepolymer to the reactive groups in the curing agent was adjusted to 1:1, and the total feeding amount was maintained at a rate of 10 kg/min. In addition, the inert gas was constantly fed in a volume of 20% based on the total volume of the urethane-based prepolymer and the curing agent.

The mixed raw materials were injected into a mold and prepared to a single sheet. Thereafter, the surface of the porous polyurethane sheet was ground using a grinder and then grooved using a tip so that it had an average thickness of 2 mm and an average diameter of 76.2 cm.

The porous polyurethane sheet and suede (a substrate layer with an average thickness of 1.1 mm) were thermally bonded at 120° C. with a hot-melt film (supplied by SKC under the brand name of TF-00) to produce a polishing pad.

Test Example

Figure 1:
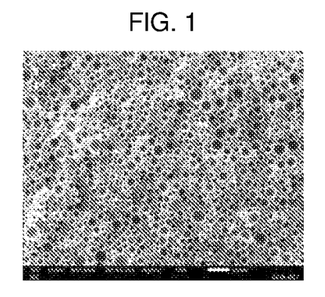
FIG. 1 is an SEM photograph of the porous polishing pad prepared in Example 1.
Figure 2:
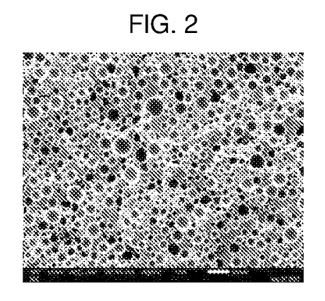
FIG. 2 is an SEM photograph of the porous polishing pad prepared in Comparative Example 1.
Figure 3:
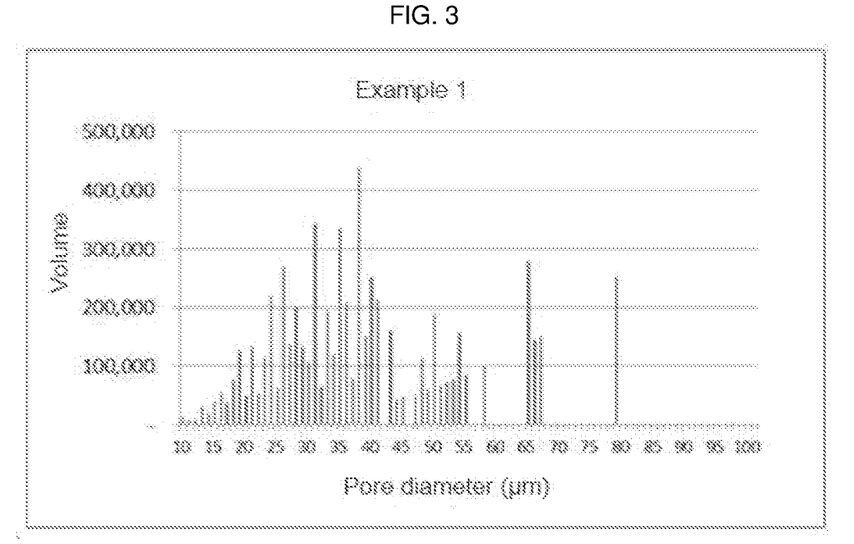
FIG. 3 is a graph showing the pore diameter distribution based on the apparent volume of the porous polishing pad prepared in Example 1.
Figure 4:
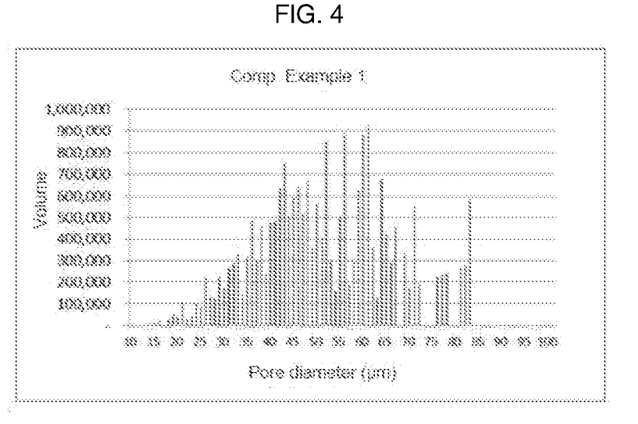
FIG. 4 is a graph showing the pore diameter distribution based on the apparent volume of the porous polishing pad prepared in Comparative Example 1.

Test Example 1: Apparent Volume-Weighted Average Pore Diameter (AVWAPD) and Pore Diameter Distribution of a Plurality of Pores The polishing pads prepared in the Examples and the Comparative Examples were each cut into a square of 1 mm×1 mm (thickness: 2 mm), and the image area was observed with a scanning electron microscope (SEM) at a magnification of 200 times. The diameter of each pore was measured from an image obtained using an image analysis software, from which the apparent volume of each of the plurality of pores and the total apparent volume were obtained. In addition, the pore diameter distribution with respect to the apparent volume was calculated therefrom. SEM photographs of the polishing pads prepared in Example 1 and Comparative Example 1 are shown in FIGS. 1 and 2, respectively. The calculated pore diameter distributions are shown in FIGS. 3 and 4, respectively. Meanwhile, the apparent volume-weighted average pore diameter (AVWAPD) calculated from the diameter and apparent volume obtained for the polishing pads prepared in Examples 1 to 4 and Comparative Examples 1 to 3 are shown in Table 2 below. In Table 2, the percentages are by volume.

As shown in Table 2, the polishing pad of Example 1 had an AVWAPD in the range of 20 μm to 50 μm, whereas the polishing pad of Comparative Example 1 had an AVWAPD of greater than 50 μm.

Test Example 2: Physical Properties of the Polishing Pad

The properties of the polishing pads prepared in Example 1 and Comparative Example 1 were measured according to the following conditions and procedures. The results are shown in Table 3 below and FIGS. 5 and 6.

(1) Specific Gravity

The polishing pads prepared in the Examples and the Comparative Examples were each cut into a square of 2 cm×2 cm (thickness: 2 mm) and then allowed to stand for 16 hours under the conditions of a temperature of 23±2° C. and a humidity of 50±5%. The specific gravity of the polishing pad was measured using a gravimeter.

(2) Hardness

1) The Shore D hardness of the polishing pads prepared in the Examples and the Comparative Examples was measured. The polishing pads were each cut into a size of 2 cm×2 cm (thickness: 2 mm) and then allowed to stand for 16 hours under the conditions of a temperature of 25° C. and a humidity of 50±5%. Thereafter, the hardness of the polishing pad was measured using a hardness meter (D-type hardness meter).

2) The same sample as in the above step 1) was immersed in distilled water at 30° C., 50° C., and 70° C. for 10 minutes, respectively, and then taken out. The hardness of the polishing pad was measured using a hardness meter (D-type hardness meter).

(3) Elastic Modulus

The polishing pads prepared in the Examples and the Comparative Examples were each subjected to the same measuring method as that for tensile strength below. The slope of the strain-stress curve in the initial elastic region was calculated.

(4) Tensile Strength

The ultimate strength immediately before the fracture was measured while the polishing pads prepared in the Examples and the Comparative Examples were each tested at a rate of 50 mm/min using a universal testing machine (UTM).

(5) Elongation

The polishing pads prepared in the Examples and the Comparative Examples were each subjected to the same measuring method as that for tensile strength above. The maximum deformation amount immediately before the fracture was measured, and the ratio of the maximum deformation amount to the initial length was expressed in percent (%).

(6) Number of Pores

The polishing pads prepared in the Examples and the Comparative Examples were each cut into a square of 1 mm×1 mm (thickness: 2 mm), and the image area was observed with a scanning electron microscope (SEM) at a magnification of 200 times. The number of pores per unit area (1 mm$^2$) was measured from an image obtained using an image analysis software.

(7) Polishing Rate of Silicon Oxide

A silicon wafer having a diameter of 300 mm with a silicon oxide layer formed by a TEOS-plasma CVD process was set in a CMP polishing machine. The silicon wafer was set on the polishing pad mounted on the platen, while the silicon oxide layer of the silicon wafer faced downward. Thereafter, the silicon oxide layer was polished under a polishing load of 1.4 psi while the platen was rotated at a speed of 115 rpm for 60 seconds, and a calcined silica slurry was supplied onto the polishing pad at a rate of 190 ml/min. Upon completion of the polishing, the silicon wafer was detached from the carrier, mounted in a spin dryer, washed with deionized water (DIW), and then dried with air for 15 seconds. The film thickness of the dried silicon wafer was measured before and after the polishing using a spectral reflectometer type thickness measuring instrument (Manufacturer: Kyence, Model: SI-F80R). Then, the polishing rate (unit: Å/min) was calculated by the following Equation 3, and the polishing profile was obtained (see FIGS. 5 and 6). Here, the changes in film thickness before and after the polishing were measured for each position on the silicon wafer (i.e., each position spaced from the center of the wafer), from which the polishing rates (unit: Å/min) were calculated by the following Equation 3. The polishing profile is a graph showing the polishing rates in the ordinate with respect to the position (i.e., distance (mm) from the center of the wafer) on the silicon wafer in the abscissa.

Polishing rate=polished thickness of a silicon wafer (Å)/polishing time (minute) [Equation 3]

TABLE 2

| Pore type | | % by volume | Ex. 1 | Ex. 2 | Ex. 3 | Ex. 4 | C. Ex. 1 | C. Ex. 2 | C. Ex. 3 |
|---|---|---|---|---|---|---|---|---|---|
| First pores | First-first pores | 5 to 10 | 6.51% | 7.21% | 5.49% | 8.19% | 4.28% | 3.75% | 9.00% |
| | First-second pores | 15 to 25 | 21.71% | 20.48% | 24.12% | 19.22% | 20.56% | 14.65% | 17.71% |
| | First-third pores | 30 to 45 | 32.19% | 33.24% | 31.75% | 31.32% | 25.33% | 30.98% | 26.76% |
| | Total | 55 to 90 | 60.41% | 60.93% | 61.36% | 58.73% | 50.17% | 49.38% | 53.47% |
| Second pores | Second-first pores | 5 to 20 | 14.79% | 15.00% | 18.02% | 19.58% | 24.17% | 26.24% | 23.47% |
| | Second-second pores | 5 to 25 | 24.80% | 24.07% | 20.62% | 21.69% | 25.66% | 24.38% | 23.06% |
| | Total | 10 to 45 | 39.59% | 39.07% | 38.64% | 41.27% | 49.83% | 50.62% | 46.53% |
| Apparent volume-weighted average pore diameter (μm) | | | 39.48 | 38.74 | 37.62 | 40.23 | 53.25 | 51.33 | 52.15 |

Figure 7:
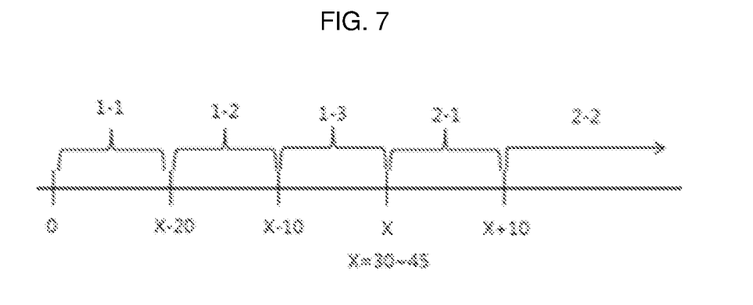
FIG. 7 is a chart showing a method for determining a pore type according to a diameter of each pore.

When the apparent volume-weighted average pore diameter (AVWAPD) is X,
The first-first pores: a diameter greater than 0 μm to X − 20 μm;
The first-second pores: a diameter greater than X − 20 μm to X − 10 μm;
The first-third pores: a diameter greater than X − 10 μm to X μm;
The second-first pores: a diameter greater than X μm to X + 10 μm; and
The second-second pores: a diameter greater than X + 10 μm (see FIG. 7)

TABLE 3

| | Ex. 1 | Ex. 2 | Ex. 3 | Ex. 4 | C. Ex. 1 | C. Ex. 2 | C. Ex. 3 |
|---|---|---|---|---|---|---|---|
| Specific gravity (g/cm$^3$) | 0.80 | 0.80 | 0.80 | 0.80 | 0.80 | 0.80 | 0.80 |
| Hardness at 25° C. (Shore D) | 57.0 | 57.0 | 57.3 | 57.2 | 57.0 | 57.1 | 57.2 |
| Hardness (Shore D) (30° C./50° C./70° C.) | 58.5/56.8/ 51.5 | 58.4/56.7/ 51.8 | 58.4/56.8/ 50.9 | 58.7/56.5/ 51.2 | 58.8/55.5/ 50.5 | 58.3/55.4/ 50.3 | 58.2/55.5/ 50.7 |
| Elastic modulus (kgf/cm$^2$) | 106.2 | 106.8 | 106.9 | 105.9 | 57.1 | 59.2 | 58.0 |
| Tensile strength (N/mm$^2$) | 20.7 | 20.8 | 21.0 | 20.5 | 20.6 | 20.6 | 20.5 |

TABLE 3-continued

|  | Ex. 1 | Ex. 2 | Ex. 3 | Ex. 4 | C. Ex. 1 | C. Ex. 2 | C. Ex. 3 |
|---|---|---|---|---|---|---|---|
| Elongation (%) | 92.7 | 92.8 | 91.9 | 93.0 | 122.0 | 119.0 | 121.2 |
| Number of pores per unit area (ea/mm²) | 953 | 996 | 1060 | 913 | 552 | 565 | 560 |
| Polishing rate (Å/min) of silicon oxide (SiO$_x$) under a silica slurry condition | 3,233 | 3,237 | 3,225 | 3,206 | 2,918 | 3,006 | 3,010 |

Figure 5:
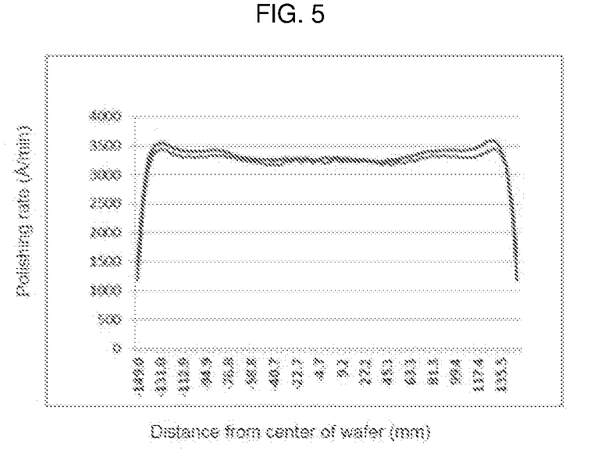
FIG. 5 is a graph showing the polishing profile of the porous polishing pad prepared in Example 1 under the condition of a silica slurry.
Figure 6:
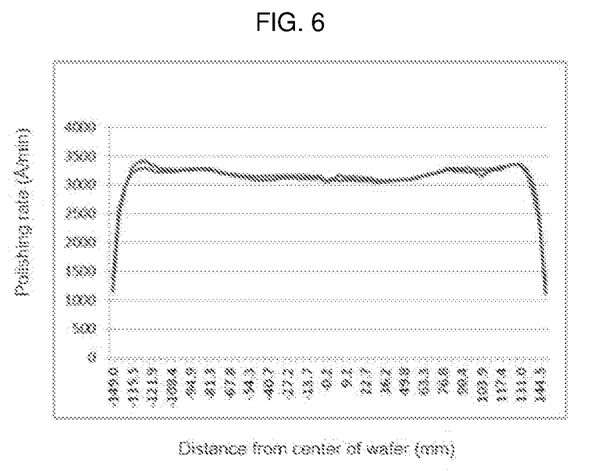
FIG. 6 is a graph showing the polishing profile of the porous polishing pad prepared in Comparative Example 1 under the condition of a silica slurry.

As shown in Table 3 above and FIG. 5, the polishing pads prepared in Examples 1 to 4 were superior to the polishing pads prepared in Comparative Examples 1 to 3 in terms of the physical properties of the polishing pad such as elastic modulus and polishing rate.

That is, as shown in Tables 2 and 3, the polishing pads (Examples 1 to 4) having an AVWAPD falling within the range of 20 μm to 50 μm had better physical properties than those of the polishing pads (Comparative Examples 1 to 3) having an AVWAPD that did not satisfy the above numerical range.

The invention claimed is:

1. A porous polishing pad, which comprises a urethane-based resin; and a plurality of pores,
    wherein the plurality of pores have an apparent volume-weighted average pore diameter (AVWAPD) of 20 μm to 50 μm as calculated according to the following Equation 1:

$$\frac{\Sigma(\text{diameter of pores} \times \text{apparent volume of pores})}{\text{total apparent volume of pores}} \quad [\text{Equation 1}]$$

and wherein when the AVWAPD is X,
    the plurality of pores comprises first pores having a diameter of greater than 0 μm to X μm and second pores having a diameter of greater than X μm, and
    the total apparent volume of the first pores is greater than the total apparent volume of the second pores.

2. The porous polishing pad of claim 1, wherein the AVWAPD is 30 μm to 45 μm.

3. The porous polishing pad of claim 1, wherein the total apparent volume of the first pores is 55% by volume to 90% by volume based on the total apparent volume of the plurality of pores, and
    the total apparent volume of the second pores is 10% by volume to 45% by volume based on the total apparent volume of the plurality of pores.

4. The porous polishing pad of claim 1, wherein the first pores comprise first group of first pores having a diameter of greater than 0 μm to X−20 μm; second group of first pores having a diameter of greater than X−20 μm to X−10 μm; and third group of first pores having a diameter of greater than X−10 μm to X μm,
    the total apparent volume of the first group of first pores is 5% by volume to 10% by volume based on the total apparent volume of the plurality of pores,
    the total apparent volume of the second group of first pores is 15% by volume to 25% by volume based on the total apparent volume of the plurality of pores, and
    the total apparent volume of the third group of first pores is 30% by volume to 45% by volume based on the total apparent volume of the plurality of pores.

5. The porous polishing pad of claim 1, wherein the second pores comprise first group of second pores having a diameter of greater than X μm to X+10 μm; and second group of second pores having a diameter of greater than X+10 μm,
    the total apparent volume of the first group of second pores is 5% by volume to 20% by volume based on the total apparent volume of the plurality of pores, and
    the total apparent volume of the second group of second pores is 5% by volume to 25% by volume based on the total apparent volume of the plurality of pores.

6. The porous polishing pad of claim 1, wherein the plurality of pores are derived from a solid phase foaming agent.

7. The porous polishing pad of claim 6, wherein the solid phase foaming agent is a mixture of at least three solid phase foaming agents that have different particle diameter distributions.

8. The porous polishing pad of claim 7, wherein the mixture of solid phase foaming agents comprises a first solid phase foaming agent;
    a second solid phase foaming agent having a D50 greater than the D50 of the first solid phase foaming agent; and
    a third solid phase foaming agent having a D50 greater than the D50 of the second solid phase foaming agent.

9. The porous polishing pad of claim 7, wherein the mixture of solid phase foaming agents comprises the first solid phase foaming agent having a D50 of 5 μm to less than 20 μm,
    the second solid phase foaming agent having a D50 of 10 μm to 30 μm, and
    the third solid phase foaming agent having a D50 of 15 μm to 60 μm.

10. The porous polishing pad of claim 8, wherein the mixture of solid phase foaming agents comprises 10% by weight to 40% by weight of the first solid phase foaming agent,
    10% by weight to 30% by weight of the second solid phase foaming agent, and
    30% by weight to 80% by weight of the third solid phase foaming agent, based on the total weight of the mixture of solid phase foaming agents.

11. The porous polishing pad of claim 1, which has a total number of pores of 600 or more per unit area (mm²) of the porous polishing pad.

12. The porous polishing pad of claim 1, which has an average polishing rate (Å/min) of 3,100 or more as calculated by the following Equation 2 when a silicon wafer having a silicon oxide film is polished with a silica slurry:

Polishing rate=polished thickness of a silicon wafer (Å)/polishing time (minute)       [Equation 2]

13. The porous polishing pad of claim 1, which has an elastic modulus of 60 kgf/cm$^2$ or more.

14. The porous polishing pad of claim 1, which has a withstand voltage of 14 kV to 23 kV,
a thickness of 1.5 mm to 2.5 mm,
a specific gravity of 0.7 g/cm$^3$ to 0.9 g/cm$^3$,
a surface hardness at 25° C. of 50 to 65 Shore D,
a tensile strength of 15 to 25 N/mm$^2$, and
an elongation of 80% to 250%.

15. The porous polishing pad of claim 9, wherein the mixture of solid phase foaming agents comprises 10% by weight to 40% by weight of the first solid phase foaming agent,
10% by weight to 30% by weight of the second solid phase foaming agent, and
30% by weight to 80% by weight of the third solid phase foaming agent, based on the total weight of the mixture of solid phase foaming agents.

16. A process for preparing the porous polishing pad of claim 1, which comprises preparing a mixture of solid phase foaming agents by mixing at least three solid phase foaming agents that have different particle diameter distributions;
preparing a raw material mixture by mixing a urethane-based prepolymer, the mixture of solid phase foaming agents, and a curing agent; and
injecting the raw material mixture into a mold and molding it.

17. The process for preparing a porous polishing pad of claim 16, wherein the raw material mixture comprises 0.5 part by weight to 10 parts by weight of the mixture of solid phase foaming agents per 100 parts by weight of the urethane-based prepolymer.

18. The process for preparing a porous polishing pad of claim 16, wherein the mixture of solid phase foaming agents comprises a first solid phase foaming agent;
a second solid phase foaming agent having a D50 greater than the D50 of the first solid phase foaming agent; and
a third solid phase foaming agent having a D50 greater than the D50 of the second solid phase foaming agent.

19. The process for preparing a porous polishing pad of claim 18,
wherein the first solid phase foaming agent has a D50 of 5 μm to less than 20 μm,
the second solid phase foaming agent has a D50 of 10 μm to 30 μm, and
the third solid phase foaming agent has a D50 of 15 μm to 60 μm.

20. The process for preparing a porous polishing pad of claim 18,
wherein the mixture of solid phase foaming agents comprises 10% by weight to 40% by weight of the first solid phase foaming agent,
10% by weight to 30% by weight of the second solid phase foaming agent, and
30% by weight to 80% by weight of the third solid phase foaming agent, based on the total weight of the mixture of solid phase foaming agents.

* * * * *